(12) United States Patent
Kuriki

(10) Patent No.: US 10,056,358 B2
(45) Date of Patent: *Aug. 21, 2018

(54) LIGHT-EMITTING MODULE

(71) Applicants: CITIZEN ELECTRONICS CO., LTD., Fujiyoshida-shi, Yamanashi (JP); CITIZEN WATCH CO., LTD., Tokyo (JP)

(72) Inventor: Shingo Kuriki, Fujiyoshida (JP)

(73) Assignees: CITIZEN ELECTRONICS CO., LTD., Fujiyoshida-Shi, Yamanashi (JP); CITIZEN WATCH CO., LTD., Nishitokyo-Shi, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/666,772

(22) Filed: Aug. 2, 2017

(65) Prior Publication Data

US 2017/0330869 A1 Nov. 16, 2017

Related U.S. Application Data

(63) Continuation of application No. 15/299,930, filed on Oct. 21, 2016, now Pat. No. 9,768,151.

(30) Foreign Application Priority Data

Oct. 23, 2015 (JP) .................................. 2015-208903

(51) Int. Cl.
*H01L 25/075* (2006.01)
*H01L 33/62* (2010.01)
(Continued)

(52) U.S. Cl.
CPC ........ *H01L 25/0753* (2013.01); *H01L 27/156* (2013.01); *H01L 33/38* (2013.01);
(Continued)

(58) Field of Classification Search
CPC ... H01L 25/0753; H01L 33/507; H01L 33/62; H01L 33/38; H01L 33/56
See application file for complete search history.

(56) References Cited

U.S. PATENT DOCUMENTS 9,768,151 B2 * 9/2017 Kuriki .................. H01L 27/156
2014/0098529 A1 4/2014 Hata et al.

FOREIGN PATENT DOCUMENTS

JP 2015/122541 A 7/2015

* cited by examiner

*Primary Examiner* — Dung Le
(74) *Attorney, Agent, or Firm* — RatnerPrestia

(57) ABSTRACT

Provided is a light-emitting module that achieves high brightness, whose electrode structure is simple and whose brightness distribution has rotational symmetry. The light-emitting module includes a substrate, a first electrode and a second electrode disposed on the substrate, LED devices connected between the first electrode and the second electrode, a dam member disposed on the substrate so as to surround the LED devices, and a phosphor-containing resin for sealing the LED devices by being filled into a region surrounded by the dam member on the substrate. The first electrode includes a first outer electrode disposed under the dam member and a first inner electrode disposed nearer to a center of the substrate than the first outer electrode is. The second electrode includes a second outer electrode disposed under the dam member and a second inner electrode disposed nearer to the center of the substrate than the second outer electrode is. The first outer electrode is disposed so as to oppose the second inner electrode. The second outer electrode is disposed so as to oppose the first inner electrode.

8 Claims, 12 Drawing Sheets

(51) Int. Cl.
*H01L 27/15* (2006.01)
*H01L 33/56* (2010.01)
*H01L 33/50* (2010.01)
*H01L 33/38* (2010.01)

(52) U.S. Cl.
CPC ............ *H01L 33/507* (2013.01); *H01L 33/56* (2013.01); *H01L 33/62* (2013.01)

LIGHT-EMITTING MODULE

CROSS REFERENCE TO RELATED APPLICATION

This application is a Continuation patent application which claims priority to U.S. patent application Ser. No. 15/299,930, filed Oct. 21, 2016, which claims benefit of Japanese Patent Application No. JP2015-208903, filed on Oct. 23, 2015, the disclosures of which are incorporated herein by reference in their entirety.

TECHNICAL FIELD

The present invention relates to a chip-on-board (COB) light-emitting module having a plurality of LED (light-emitting diode) devices.

BACKGROUND

In recent years, LED devices as semiconductor devices have come into wide use in lighting and other applications because of their long life and excellent driving characteristics and because of their compact size, good luminous efficacy, and crisp and bright color emission.

Generally, in a COB light-emitting module, anode (positive) and cathode (negative) electrodes and a plurality of LED devices are arranged on a substrate, and the plurality of LED devices are electrically connected in series by means of wire bonds between the electrodes (for example, refer to Japanese Unexamined Patent Publication No. 2015-122541). The LED devices need not necessarily be arranged in a single string, but may be arranged in a plurality of strings connected in parallel between the electrodes.

SUMMARY

To achieve a high-brightness light source apparatus for applications such as floodlighting, high-ceiling lighting, or stadium lighting or illumination by using LED devices, there is a need for a light-emitting module constructed by mounting LED devices at high density. When a large number of LED devices are mounted close together, the number of LED devices connected in series between the electrodes of the light-emitting module increases. Since the voltage necessary to drive each LED device is the same, if the number of LED devices contained in a single series connection increases, the voltage to be applied between the electrodes also increases. This can lead to a situation where the voltage to be supplied to the light-emitting module exceeds the capacity of the DC power supply that can be used; therefore, when using such a light-emitting module, there is a need to provide a larger-capacity power supply that can supply a higher voltage.

One possible solution to this problem is to construct one of the electrodes (anode or cathode) from a plurality of electrodes (conductive patterns) and arrange the electrodes also between the LED devices on the substrate thereby reducing the number of LED devices to be connected in series in each LED string. However, in this case, it is standard practice to form multiple wiring layers in order to electrically connect the plurality of electrodes by electrically isolating them from the others; furthermore, there are cases where the bonding wires interconnecting the LED devices are routed to run over such electrodes. In this way, if one of the electrodes is constructed from a plurality of electrodes in order to reduce the number of LED devices to be connected in series, the electrode structure and the bonding wire routing become complex.

Furthermore, it is desirable that a light-emitting module used for floodlighting have a rotationally symmetrical brightness distribution.

Accordingly, it is an object of the present invention to provide a light-emitting module that achieves high brightness, whose electrode structure is simple and whose brightness distribution has rotational symmetry.

Provided is a light-emitting module including a substrate, a first electrode and a second electrode disposed on the substrate, a plurality of LED devices connected between the first electrode and the second electrode, a dam member disposed on the substrate so as to surround the plurality of LED devices, and a phosphor-containing resin for sealing the plurality of LED devices by being filled into a region surrounded by the dam member on the substrate, wherein the first electrode includes a first outer electrode disposed under the dam member and a first inner electrode disposed nearer to a center of the substrate than the first outer electrode is, and the second electrode includes a second outer electrode disposed under the dam member and a second inner electrode disposed nearer to the center of the substrate than the second outer electrode is, wherein the first outer electrode is disposed so as to oppose the second inner electrode, and the second outer electrode is disposed so as to oppose the first inner electrode.

Preferably, neither the first inner electrode nor the second inner electrode is disposed in a central portion of a mounting region surrounded by the dam member on the substrate, and some of the plurality of LED devices are disposed in a center region defined between the first inner electrode and the second inner electrode and containing the central portion of the mounting region.

Preferably, the plurality of LED devices are arranged in a number, M, of LED strings, and each LED string includes a number, N, of LED devices connected in series between the first electrode and the second electrode, where M is larger than N.

Preferably, the LED strings disposed in the center region are connected to the first inner electrode and the second inner electrode, and the LED strings disposed in peripheral regions defined between the first outer electrode and the second inner electrode and between the second outer electrode and the first inner electrode are connected to the first outer electrode and the second inner electrode or to the first inner electrode and the second outer electrode, respectively.

Preferably, the dam member is annular in shape, the first outer electrode and the second outer electrode are both arcuate in shape, and the first inner electrode and the second inner electrode are both arcuate in shape and are arranged around the same circumference, and wherein the first electrode further includes a first connecting electrode, formed in a straight line pattern, for connecting the first outer electrode to the first inner electrode, and the second electrode further includes a second connecting electrode, formed in a straight line pattern, for connecting the second outer electrode to the second inner electrode.

Preferably, the first inner electrode and the second inner electrode each include a plurality of arcuate electrodes the number of which is the same between the first inner electrode and the second inner electrode, and the plurality of arcuate electrodes are arranged in concentric circles.

Preferably, the first electrode and the second electrode are point-symmetric to each other with respect to the center of the electrode.

Preferably, the plurality of LED devices in the peripheral regions are arranged in radially extending fashion with respect to the center of the substrate.

Preferably, the LED devices arranged as LED strings in the peripheral regions are arranged in concentric circles each containing like numbered LED devices from the respective LED strings.

Preferably, distributions of mounting positions and rotation angles of the plurality of LED devices are point-symmetric with respect to the center of the substrate.

Preferably, the substrate includes a mounting substrate and a circuit substrate placed on top of the mounting substrate, and wherein the first electrode and the second electrode are disposed on the circuit substrate, the circuit substrate includes an aperture, and the plurality of LED devices are mounted on a region of the mounting substrate that is exposed through the aperture.

According to the present invention, a light-emitting module that achieves high brightness, whose electrode structure is simple and whose brightness distribution has rotational symmetry can be achieved.

BRIEF DESCRIPTION OF THE DRAWINGS

Other features and advantages of the present invention will be apparent from the ensuing description, taken in conjunction with the accompanying drawings, in which.

DESCRIPTION

Hereinafter, with reference to the accompanying drawings, light-emitting modules will be explained in detail. However, it should be noted that the present invention is not limited to the drawings or the embodiments described below.

Figure 1:
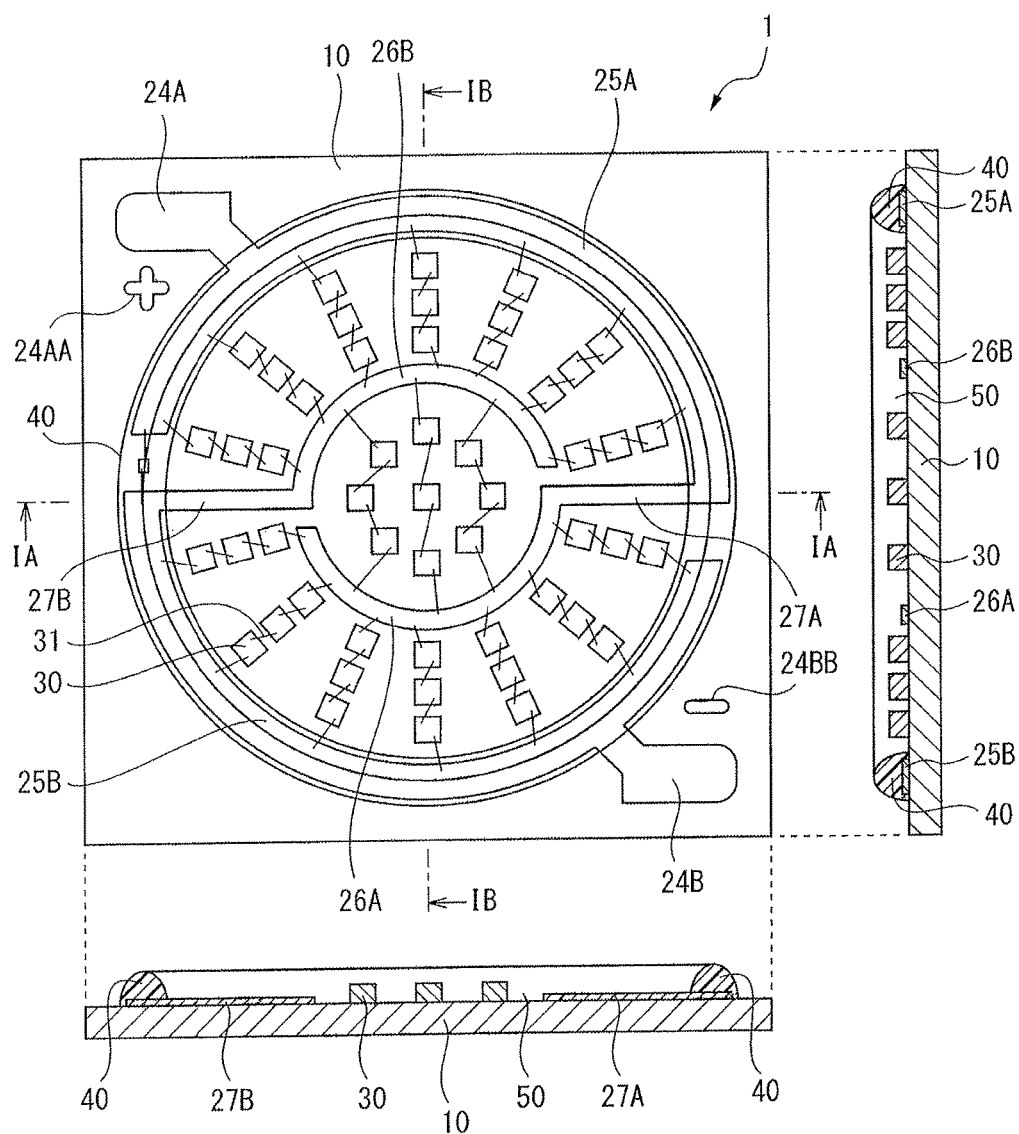
FIG. 1 shows a top plan view and cross-sectional views of a light-emitting module 1.

FIG. 1 shows a top plan view of a light-emitting module 1 along with two cross-sectional views taken along IA and IB in the top plan view. The light-emitting module 1 includes, as its major component elements, a mounting substrate 10, LED devices 30, a reflecting frame 40, and a sealing resin 50. The light-emitting module 1 is used as an LED light source in a high-brightness light source apparatus used for such applications as floodlighting, high-ceiling lighting, or stadium lighting or illumination, and emits white light. However, the color of the light to be emitted from the light-emitting module 1 need not be limited to white.

In the cross-sectional views of FIG. 1, only the elements existing in the respective cross sections are shown, and any element existing inwardly of the cross sections is omitted from illustration for ease of viewing. The transparent sealing resin 50 containing phosphors is deposited as an uppermost layer of the light-emitting module 1, but since it is transparent, the portions underlying the top layer are viewable and are shown by solid lines in the top plan view of FIG. 1. On the other hand, the reflecting frame 40 is opaque, but in the top plan view of FIG. 1, the reflecting frame 40 is shown as if it were transparent.

FIGS. 2 to 6 are top plan views of the mounting substrate 10, the mounting substrate 10 on which the LED devices 30 are mounted, the mounting substrate 10 on which the LED devices 30 are connected together by bonding wires (hereinafter simply referred to as wires) 31, the mounting substrate 10 on which the reflecting frame 40 is formed, and the mounting substrate 10 sealed with the sealing resin 50, respectively. FIGS. 2 to 6 correspond to diagrams showing the manufacturing process of the light-emitting module 1 in sequence.

Figure 2:
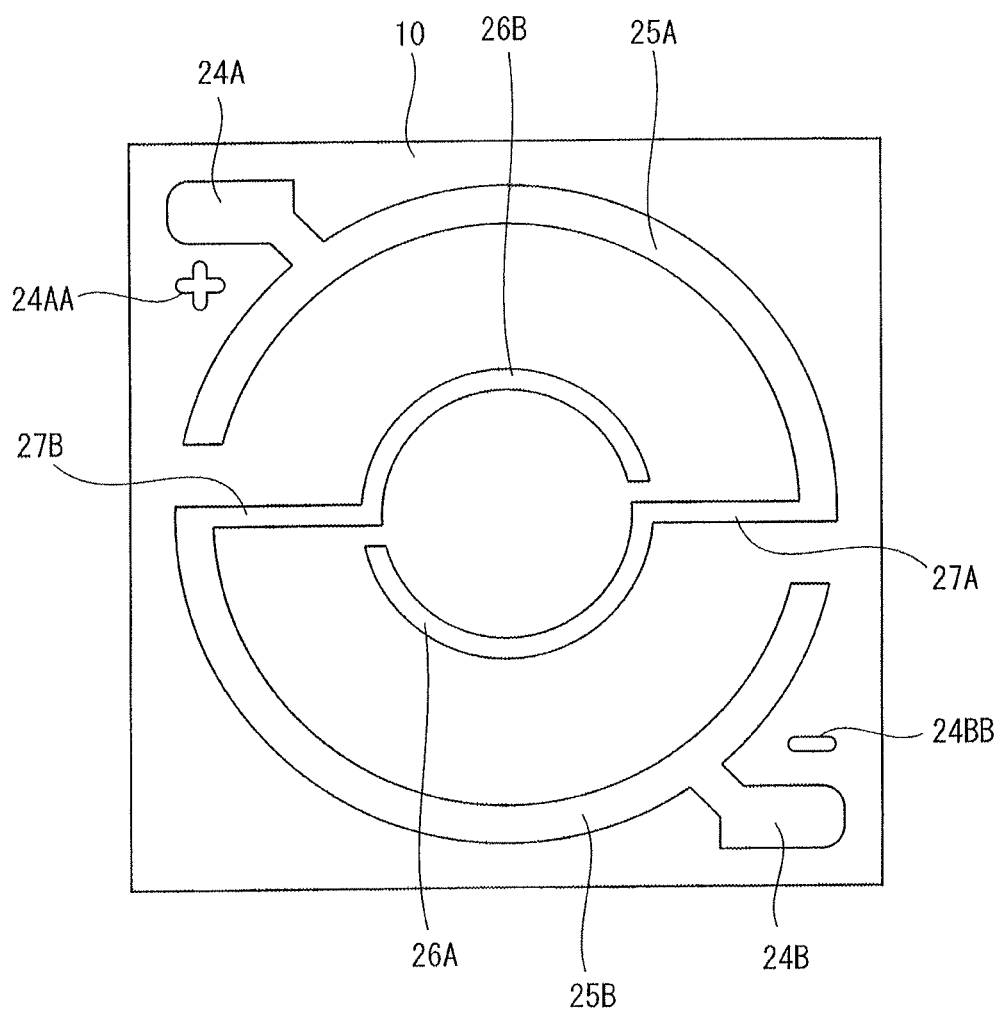
FIG. 2 shows a top plan view of the mounting substrate 10.

As shown in FIG. 2, the mounting substrate 10 is a planar ceramic substrate on the upper surface of which the LED devices 30 are to be mounted; as an example, the substrate has a square shape. Conductive patterns are formed on the upper surface of the mounting substrate 10. The conductive patterns include a first terminal electrode 24A, a second terminal electrode 24B, a first outer electrode 25A, a second outer electrode 25B, a first inner electrode 26A, a second inner electrode 26B, a first connecting electrode 27A, and a second connecting electrode 27B. The conductive patterns are formed, for example, from a gold plated layer. A highly reflectorized layer (reflective layer) such as a silver plated layer, for example, is formed everywhere on the upper surface of the mounting substrate 10 except where the conductive patterns are formed. The highly reflectorized layer may be an enhanced reflective film such as a dielectric multilayer film.

The first terminal electrode 24A and the second terminal electrode 24B are respectively formed near two diagonally opposed corners of the mounting substrate 10. The first terminal electrode 24A is an anode (positive) electrode, and the second terminal electrode 24B is a cathode (negative) electrode; when a voltage is applied from an external power supply across the pair of terminal electrodes, the light-emitting module 1 emits light. The patterns indicated by reference numerals 24AA and 24BB near the first terminal electrode 24A and the second terminal electrode 24B, respectively, are the patterns indicating the polarities of the first terminal electrode 24A and the second terminal electrode 24B, respectively. These patterns are not conductive patterns, but are formed in the same processing step as the conductive pattern forming step.

The first outer electrode 25A and the second outer electrode 25B are arcuate patterns formed around a circumference of the same radius (first radius) centered at the center of the mounting substrate 10, and are located under the annular reflecting frame 40. Preferably, the first outer electrode 25A and the second outer electrode 25B are each formed as long as possible while satisfying the condition that they do not overlap each other, and each of these arcuate electrodes has a length that makes an angle smaller than 180 degrees but as close as possible to 180 degrees with respect to the center. Actually, the first outer electrode 25A and the second outer electrode 25B are each formed to have a length that makes an angle of 170 degrees with respect to the center, for example, by considering a pattern formation error and the mutual insulation between the electrodes.

The first inner electrode 26A and the second inner electrode 26B are arcuate patterns formed around a circumference of the same radius (second radius) centered at the center of the mounting substrate 10, and are formed so as not to overlap each other, as in the case of the first outer electrode 25A and the second outer electrode 25B. The second radius is smaller than the first radius, and the first inner electrode 26A and the second inner electrode 26B are disposed nearer to the center of the mounting substrate 10 (farther inwardly spaced away from the reflecting frame 40) than the first outer electrode 25A and the second outer electrode 25B are. The first outer electrode 25A and the second outer electrode 25B are arranged in concentric relation with the first inner electrode 26A and the second inner electrode 26B.

As shown in FIG. 2, the first outer electrode 25A and the second inner electrode 26B are disposed on the same side (the upper side in the figure) with respect to the center of the mounting substrate 10, and the second outer electrode 25B and the first inner electrode 26A are disposed on the side (the lower side in the figure) opposite to the first outer electrode 25A and the second inner electrode 26B with respect to the center of the mounting substrate 10. That is, the first outer electrode 25A is disposed so as to oppose the second inner electrode 26B, while the second outer electrode 25B is disposed so as to oppose the first inner electrode 26A. The first radius and the second radius are chosen so that the distance measured between the first outer electrode 25A and the second inner electrode 26B in the radial direction, for example, becomes approximately equal to the distance measured between the second inner electrode 26B and the first inner electrode 26A in the radial direction.

The first connecting electrode 27A is a straight line pattern that connects one end of the first outer electrode 25A to one end of the first inner electrode 26A, and the second connecting electrode 27B is a straight line pattern that connects one end of the second outer electrode 25B to one end of the second inner electrode 26B. The first connecting electrode 27A and the second connecting electrode 27B are disposed opposite each other across the center of the mounting substrate 10.

As shown in FIG. 2, the first terminal electrode 24A, the first outer electrode 25A, the first connecting electrode 27A, and the first inner electrode 26A are connected together to form a first electrode. Likewise, the second terminal electrode 24B, the second outer electrode 25B, the second connecting electrode 27B, and the second inner electrode 26B are connected together to form a second electrode. The first electrode and the second electrode are point-symmetric to each other with respect to the center of the mounting substrate 10. When a voltage is applied between the first terminal electrode 24A and the second terminal electrode 24B from the external power supply, the electrodes forming the first electrode are at the same potential, and the electrodes forming the second electrode are also at the same potential.

Though not shown here, in the mounting substrate 10, fixing through-holes may be formed near two diagonally opposed corners other than the two diagonally opposed corners where the first terminal electrode 24A and the second terminal electrode 24B are respectively formed.

Figure 3:
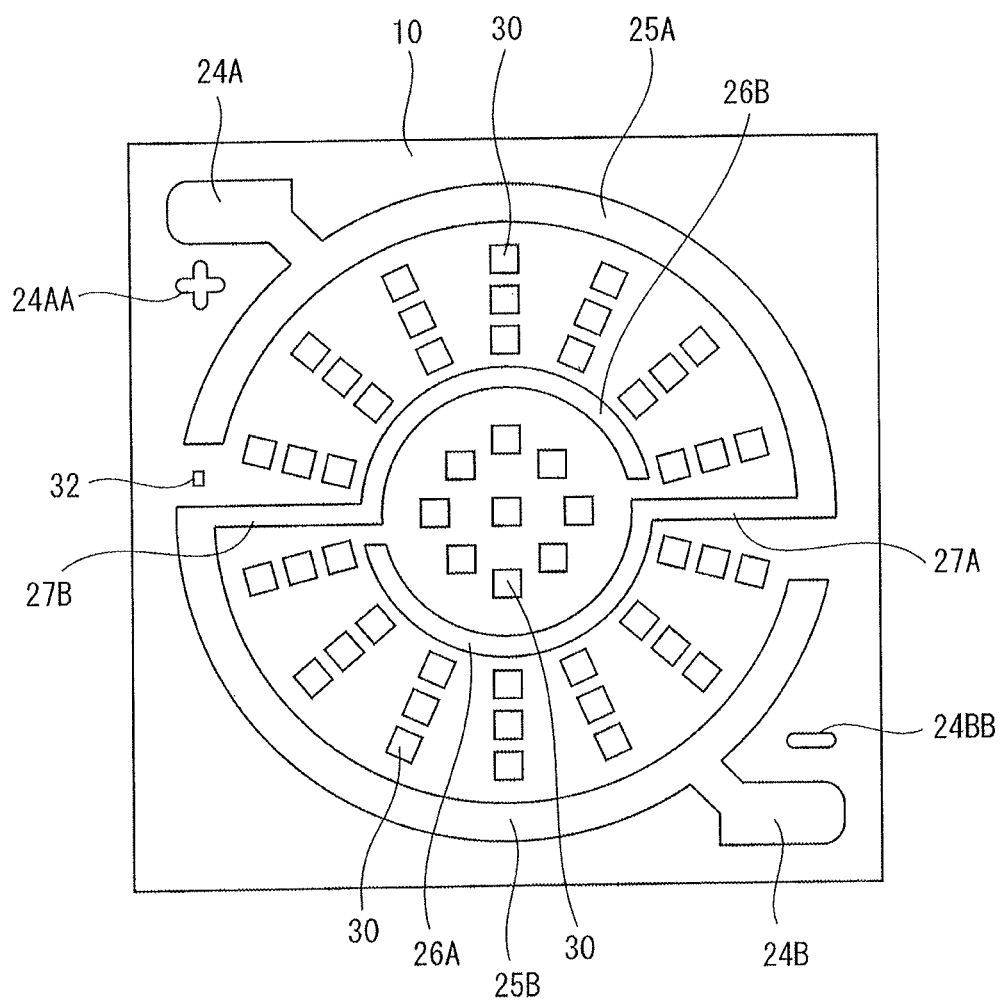
FIG. 3 shows a top plan view of the mounting substrate 10 on which the LED devices 30 are mounted.

The LED devices 30 are each an example of a light-emitting device, which is, for example, a blue LED that emits blue light at a wavelength in the range of about 450 to 460 nm. As shown in FIG. 3, the plurality of LED devices 30 (numbering 51 in total) are mounted on the mounting substrate 10 of the light-emitting module 1, and these LED devices emit blue light of the same wavelength. However, the LED devices 30 are not limited to blue LEDs, but may be, for example, violet LEDs or near ultraviolet LEDs, and their emission wavelength may be in the range of about 200 to 460 nm containing the ultraviolet region. The bottom face of each LED device 30 is fixedly bonded to the upper surface of the mounting substrate 10 by such means as an electrically insulating transparent adhesive. Since the LED devices 30 are bonded directly to the ceramic mounting substrate 10 or to the silver plated layer, high heat dissipation is achieved and light of high output power can be produced.

The pair of first and second inner electrodes 26A and 26B is not disposed in the central portion of the region (the mounting region for the LED devices 30) surrounded by the reflecting frame 40 on the mounting substrate 10, and a circular center region bounded by the first and second inner electrodes 26A and 26B is formed in the central portion of the mounting substrate 10. A total of nine LED devices 30 are arranged in this center region. One of them is mounted at the center of the mounting substrate 10, and the other eight are located at the same radial distance from the center (that is, arranged around the circumference of the same circle). Since the first and second inner electrodes 26A and 26B are formed by avoiding the central portion of the mounting substrate 10, the area for mounting the LED devices 30 can also be secured in the central portion of the light-emitting region. Accordingly, in the light-emitting module 1, the central portion of the light-emitting region illuminates brightly, and the axial luminous intensity can thus be increased. The same applies for other light-emitting modules to be described later.

Twenty-one LED devices 30 are arranged in each of the upper peripheral region defined between the first outer electrode 25A and the second inner electrode 26B and the lower peripheral region defined between the second outer electrode 25B and the first inner electrode 26A. More specifically, a total of 14 strings of LED devices 30, each string consisting of three linearly arranged LED devices, are disposed in these regions. The strings of LED devices 30 are arranged in a substantially equiangularly spaced, radially extending fashion with respect to the center of the mounting substrate 10, and the LED devices 30 arranged as strings are arranged in three concentric circles each containing like numbered LED devices 30 from the respective strings. In the light-emitting module 1, the distribution of the mounting positions of the LED devices 30 has rotational symmetry (point symmetry) about the center of the mounting substrate 10.

The component indicated at reference numeral 32 is a Zener diode device which protects the LED devices 30 when an overvoltage is applied between the first electrode and the second electrode.

Figure 4:
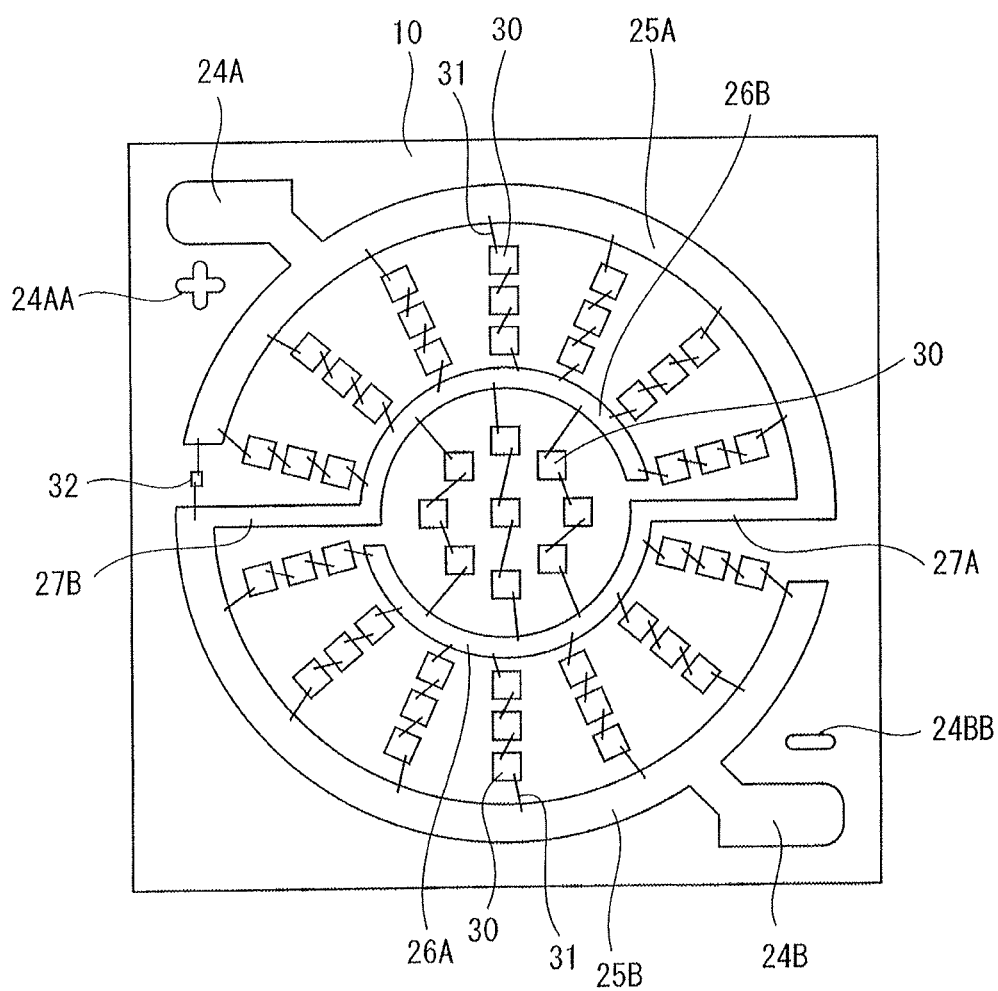
FIG. 4 shows a top plan view of the mounting substrate 10 on which the LED devices 30 are connected together by bonding wires 31.

Each LED device 30 has a pair of device electrodes on its top face. As shown in FIG. 4, the device electrodes of the three adjacent LED devices 30 in each string are connected in series by wires 31, and the device electrode of the LED device 30 at each end of the string is connected to the first electrode or second electrode by a wire 31.

In the center region, the nine LED devices 30 are arranged in three strings each extending vertically in FIG. 4. The device electrodes of the three LED devices 30 in each string are connected in series by wires 31, and the device electrode of the LED device 30 at each end of the string is connected to the first inner electrode 26A or second inner electrode 26B by a wire 31. Stated another way, the three LED devices 30 in each string are connected in series by wires 31 between the first inner electrode 26A and the second inner electrode 26B.

In the upper peripheral region, the 21 LED devices 30 are arranged in seven LED strings each consisting of three LED devices 30 arranged in radially extending fashion with respect to the center of the mounting substrate 10. The three LED devices 30 in each string are connected in series by wires 31 between the first outer electrode 25A and the second inner electrode 26B. Likewise, in the lower peripheral region also, the 21 LED devices 30 are arranged in seven LED strings, and the three LED devices 30 in each string are connected in series by wires 31 between the first inner electrode 26A and the second outer electrode 25B. In the light-emitting module 1, since the first electrode and the second electrode are formed from a gold plated layer, good wire bonding can be achieved, which serves to enhance the reliability of the connections.

The light-emitting module 1 has a total of 17 LED strings, and each LED string is made up of three LED devices connected in series between the first electrode and the second electrode. That is, in the light-emitting module 1, the number of parallel-connected LED strings (17 parallel-connected strings) is larger than the number of LED devices 30 contained in each series connection (three series-connected devices).

In the two peripheral regions, the 14 strings of LED devices 30 are arranged in a substantially equiangularly spaced, radially extending fashion with respect to the center of the mounting substrate 10, and the LED devices 30 arranged as strings are arranged in the concentric circles each containing like numbered LED devices 30 from the respective strings; thus forming a light-emitting module whose brightness distribution is rotationally symmetric and whose light-emitting region is circular in shape.

Figure 5:
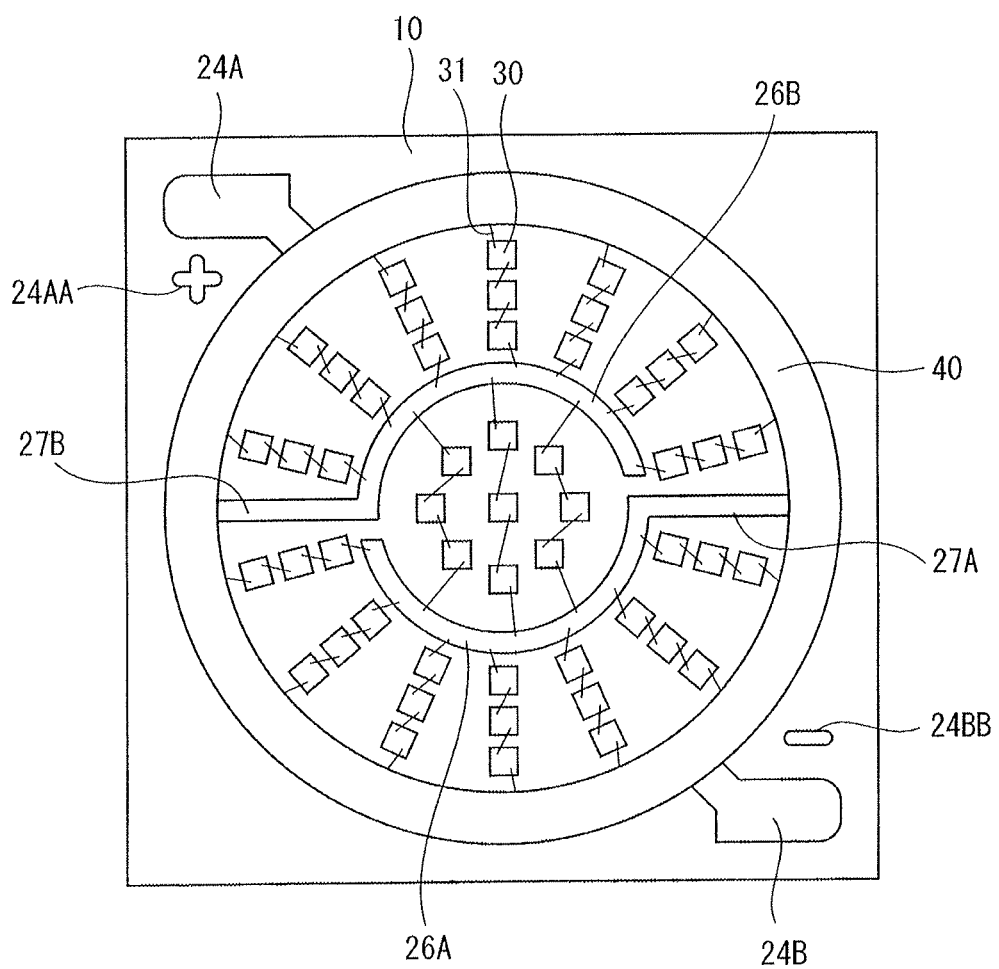
FIG. 5 shows a top plan view of the mounting substrate 10 on which the reflecting frame 40 is formed.

As shown in FIG. 5, the reflecting frame 40 is an annular frame member (dam member) for preventing the sealing resin 50 deposited on the mounting substrate 10 from flowing out, and is formed in a position overlapping the first outer electrode 25A and second outer electrode 25B on the mounting substrate 10 so as to cover the electrodes and surround the LED devices 30. The reflecting frame 40 is formed from a reflective white resin, and the light emitted in lateral directions from the LED devices 30 is reflected by the reflecting frame 40 toward the upper side of the light-emitting module 1 (the side opposite from the mounting substrate 10 as seen from the LED devices 30). In the light-emitting module 1, since the light emitted from the LED devices 30 is reflected upward by the reflecting frame 40 as well as the reflective layer formed on the mounting substrate 10, the light emission efficiency increases.

Figure 6:
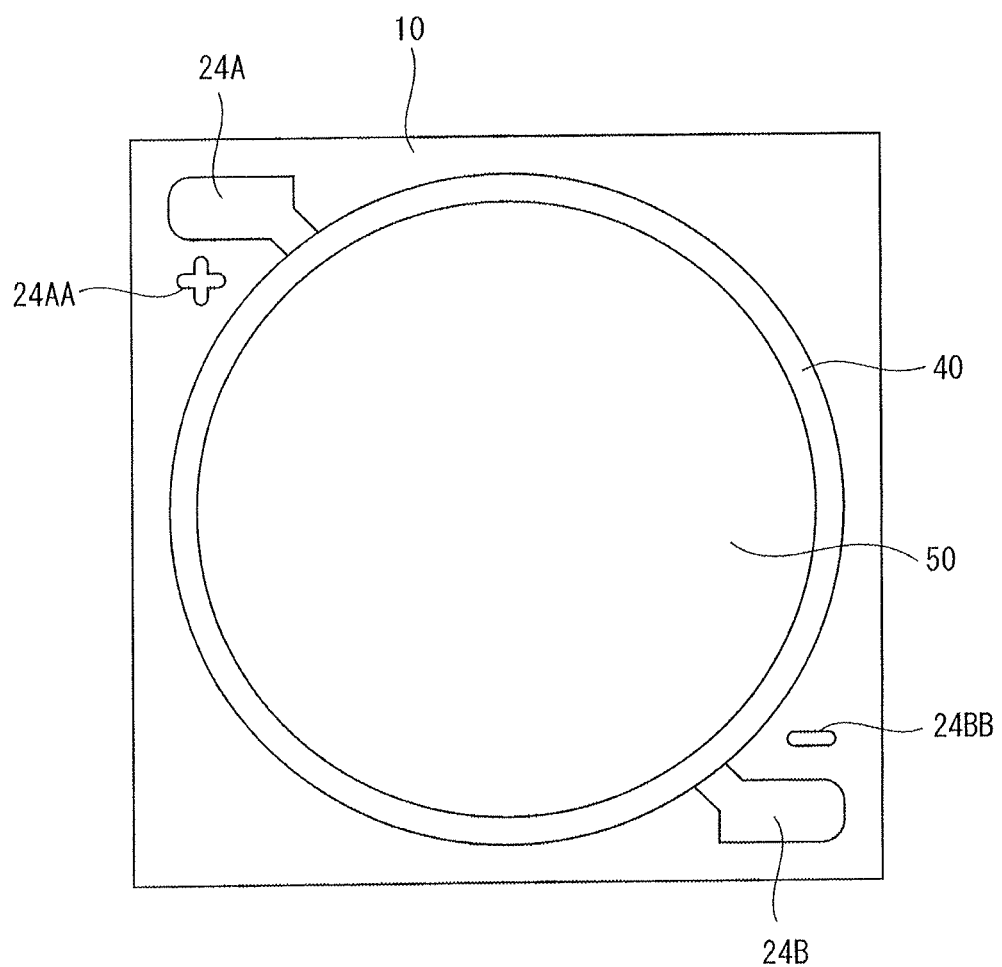
FIG. 6 shows a top plan view of the mounting substrate sealed with the sealing resin 50.

As shown in FIG. 6, the sealing resin 50 is injected (filled) into the space surrounded by the reflecting frame 40 formed on the mounting substrate 10, and is cured in the shape of a disc to integrally cover and protect (seal) the plurality of LED devices 30. It is preferable to use a colorless and transparent resin, such as an epoxy resin or a silicone resin, in particular, a resin having a heat resistance up to about 250° C., as the sealing resin 50.

The sealing resin 50 is prepared by dispersing therethrough phosphors for converting the wavelength of the light emitted from each LED device 30. The sealing resin 50 contains two kinds of such phosphors, for example, a green phosphor and a red phosphor. The light-emitting module 1 produces white light by combining the blue light emitted from the blue LED devices 30 with the green light and red light generated by exciting the green phosphor and red phosphor with the emitted light. The green phosphor is, for example, a particulate phosphor material, such as $(BaSr)_2SiO_4:Eu^{2+}$, that absorbs the blue light emitted from the LED devices 30 and wavelength-converts it into green light. The red phosphor is, for example, a particulate phosphor material, such as $CaAlSiN_3:Eu^{2+}$, that absorbs the blue light emitted from the LED devices 30 and wavelength-converts it into red light.

In the light-emitting module 1, since the LED devices 30 are closely packed together, the amount of heat generation per unit area of the light-emitting area is large. When the LED devices are closely packed together, and the density of light increases, the density of the light striking the phosphors contained in the sealing resin 50 also increases, and the temperature of the phosphors rises. To address this, in the light-emitting module 1, the phosphors contained in the sealing resin 50 are allowed to settle out and are thus brought closer to the mounting substrate 10 to increase heat dissipation from the phosphors so that the heat can be easily dissipated.

The green phosphor is larger in particle size and heavier in weight than the red phosphor. As a result, when the green phosphor and the red phosphor are allowed to settle out before the sealing resin 50 is cured during the manufacture of the light-emitting module 1, a layer containing a larger amount of green phosphor, a layer containing a larger amount of red phosphor, and a resin layer that contains hardly any green phosphor or red phosphor are formed within the sealing resin 50 because of the difference in specific gravity between the two kinds of phosphors. That is, the first layer containing principally the green phosphor, the second layer containing principally the red phosphor, and the third layer that contains the green phosphor and red phosphor in much less amounts than the first and second layers are formed within the sealing resin 50 in order of increasing distance from the mounting substrate 10.

For example, the thermal conductivity of a silicone resin is about 0.1 to 0.4 W/mK, but the thermal conductivity of a phosphor is much higher than that and as high as about 9 to 14 W/mK. Between the different kinds of phosphors, the thermal conductivity of the green phosphor is higher than that of the red phosphor. Accordingly, with the formation of the first to third layers within the sealing resin 50, the thermal conductivity increases with decreasing distance to the mounting substrate 10. As a result, in the light-emitting module 1, compared with the case where such a multilayer structure is not formed, heat can be transferred more efficiently from the entire region of the sealing resin 50 to the mounting substrate 10. Further, since the mounting substrate 10 is formed from a ceramic material having an excellent heat dissipation property, sufficient heat dissipation can be ensured even if the packing density of LED devices 30 is increased.

The sealing resin 50 may further contain a yellow phosphor such as YAG (yttrium aluminum garnet) in addition to the green and red phosphors, or may contain a combination of phosphors, for example, yellow and red phosphors, different from the above combination. Alternatively, the sealing resin 50 may contain only one kind of phosphor, a yellow phosphor. In this case, the light-emitting module 1 produces white light by combining the blue light emitted from the blue LED devices 30 with the yellow light generated by exciting the yellow phosphor with the emitted light.

The manufacturing process of the light-emitting module 1 proceeds as shown in FIGS. 2 to 6. First, the mounting substrate 10 shown in FIG. 2 is prepared; then, as shown in FIGS. 3 and 4, the LED devices 30 are mounted on the mounting substrate 10, and the LED devices 30 are connected together by wires 31. Further, the reflecting frame 40 is formed as shown in FIG. 5, and the LED devices 30 are sealed with the sealing resin 50 as shown in FIG. 6.

In the light-emitting module 1, the center region, the upper peripheral region, and the lower peripheral region together form a circular region bounded by the arcuate first outer electrode 25A and second outer electrode 25B. The first inner electrode 26A, the second inner electrode 26B, the first connecting electrode 27A, and the second connecting electrode 27B are disposed within this circular region, but the proportion of the area occupied by these electrodes is relatively small. Accordingly, a large number of LED devices 30 can be arranged within this circular region, and this permits the packing density of LED devices 30 to be increased.

The first and second electrodes of the light-emitting module 1 are simple in structure, obviating the need for multilayer wiring, and are disposed opposite each other so as to define the center region, the upper peripheral region, and the lower peripheral region therebetween. The distance between the opposing electrodes is chosen so that each string of three LED devices 30 can be arranged in the radial direction. This means that such three LED devices 30 arranged between the first electrode and the second electrode can be easily connected in series by wires 31. Furthermore, all the LED devices 30 can be caused to emit light by applying a relatively small voltage between the first electrode and the second electrode, the voltage being sufficient to cause the three series-connected LED devices 30 to emit light. In this way, the light-emitting module 1 contains a relatively large number of LED devices 30 but, since the number of LED devices 30 connected in series between the electrodes is small, and the voltage necessary for driving them is therefore small, high-brightness light emission can be achieved with a relatively small voltage.

Figure 7:
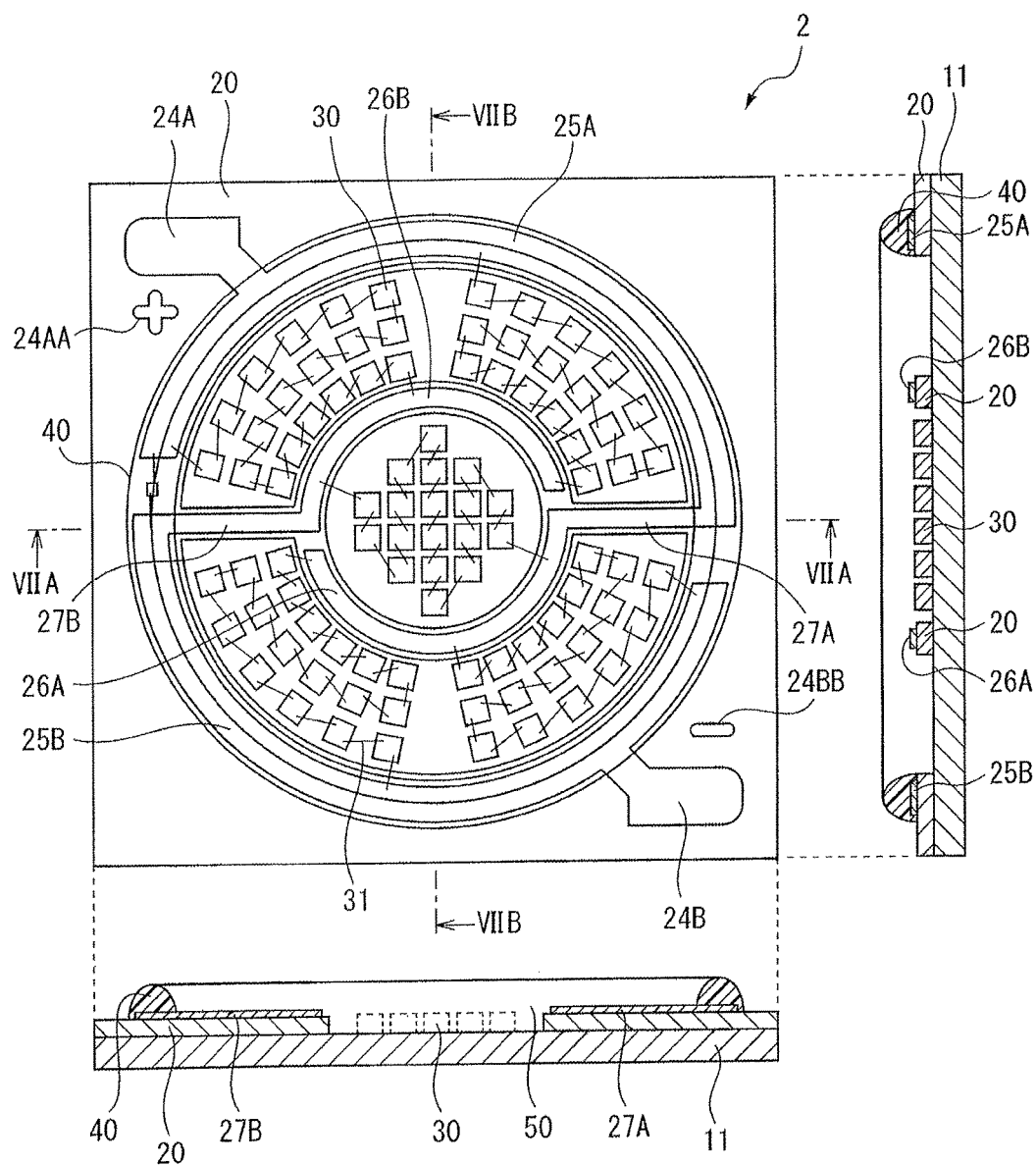
FIG. 7 shows a top plan view and cross-sectional views of an alternative light-emitting module 2.

FIG. 7 shows a top plan view of an alternative light-emitting module 2 along with two cross-sectional views taken along VIIA and VIIB in the top plan view. In the cross-sectional views of FIG. 7 also, only the elements existing in the respective cross sections are shown, and any element existing inwardly of the cross sections, except those elements indicated by dotted lines, is omitted from illustration for ease of viewing. Further, in the top plan view of FIG. 7, the portions underlying the top layer are shown by solid lines, as in FIG. 1.

The light-emitting module 2 includes, as its major component elements, a mounting substrate 11, a circuit substrate 20, LED devices 30, a reflecting frame 40, and a sealing resin 50. The light-emitting module 2 is substantially identical in structure to the light-emitting module 1, the only differences being the substrate structure and the number of LED devices 30 connected and their arrangement. Therefore, the same portions as those of the light-emitting module 1 are designated by the same reference numerals and will not be further described herein. The light-emitting module 2 will be described below by dealing only with the differences from the light-emitting module 1.

As shown in FIG. 7, the mounting substrate 11 is a planar metal substrate constructed, for example, from an aluminum base having excellent heat resistance and heat dissipation characteristics, and the LED devices 30 are mounted on the upper surface of this substrate; as an example, the substrate has a square shape. An enhanced reflective film such as a dielectric multilayer film, for example, is formed as a highly reflectorized layer on the upper surface of the mounting substrate 11. However, if the mounting substrate 11 is formed from a material, such as aluminum or silver, that has high reflectivity, the enhanced reflective film need not necessarily be provided, but an electrically insulating transparent film may be formed on the upper surface of the mounting substrate 11 for insulating purposes. Though not shown here, fixing through-holes may be formed near two diagonally opposed corners of the mounting substrate 11.

Figure 8:
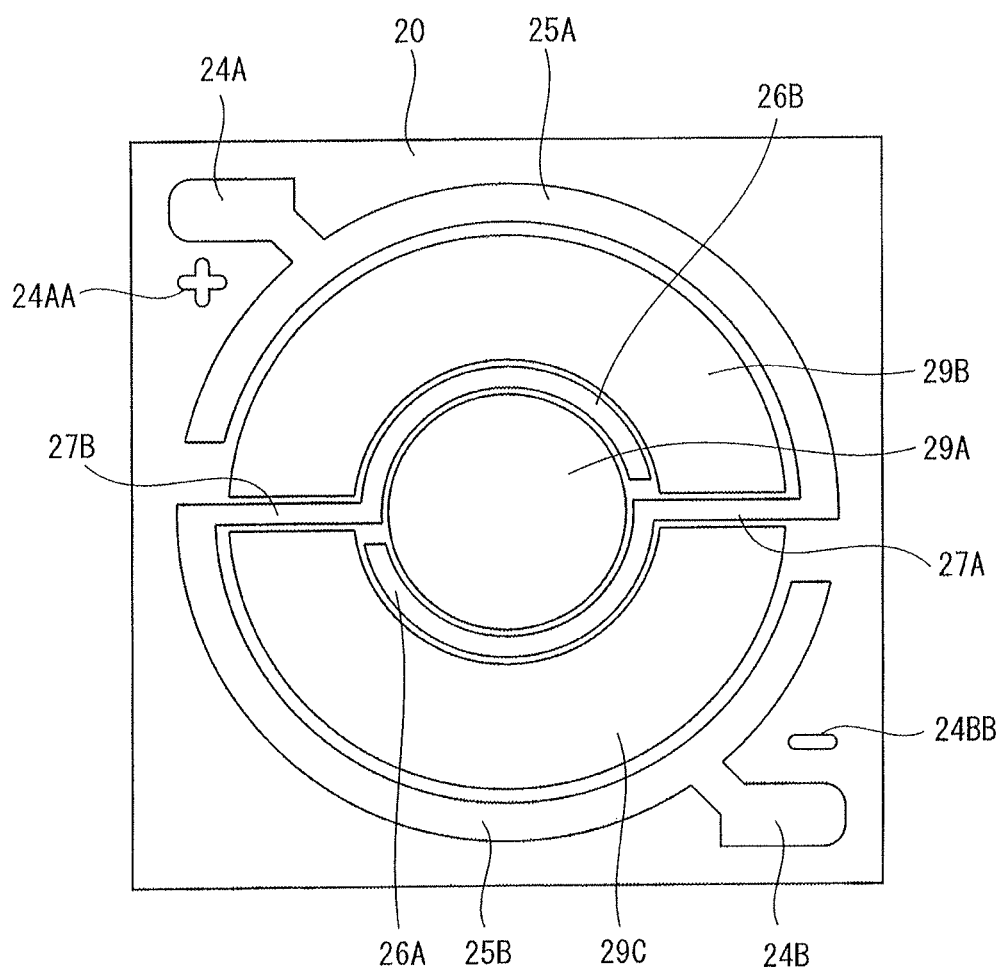
FIG. 8 is a top plan view of the circuit substrate 20.

FIG. 8 is a top plan view of the circuit substrate 20. The circuit substrate 20 is an insulating substrate such as a glass epoxy substrate, and as an example, has a square shape of the same size as the mounting substrate 11. As shown in FIG. 8, the first and second electrodes of the same configuration as that employed in the light-emitting module 1 are formed on the upper surface of the circuit substrate 20; the first outer electrode 25A and the second outer electrode 25B are located under the annular reflecting frame 40 (see FIG. 7). Though not shown here, if the mounting substrate 11 is formed with fixing through-holes, the circuit substrate 20 is also formed with fixing through-holes in corresponding positions. Then, the circuit substrate 20 is placed by aligning its fixing through-holes with the fixing through-holes formed in the mounting substrate 11, and fixed in position by bonding its lower surface to the mounting substrate 11, for example, by such means as an adhesive sheet.

As shown in FIG. 8, three apertures 29A, 29B, and 29C are formed in the circuit substrate 20 so that the LED devices 30 can be mounted directly on the mounting substrate 11. The aperture 29A has a circular shape surrounded by the first and second inner electrodes 26A and 26B. The aperture 29B and the aperture 29C are symmetric to each other with respect to a straight line extending horizontally in FIG. 8 so as to divide the circuit substrate 20 into the upper and lower halves, and the two together form a substantially annular shape surrounding the aperture 29A. The aperture 29B is surrounded by the first outer electrode 25A, the first connecting electrode 27A, the second inner electrode 26B, and the second connecting electrode 27B, while the aperture 29C is surrounded by the first inner electrode 26A, the first connecting electrode 27A, the second outer electrode 25B, and the second connecting electrode 27B. The regions of the mounting substrate 11 that are exposed through the apertures 29A, 29B, and 29C correspond to the center region, the upper peripheral region, and the lower peripheral region, respectively.

In the light-emitting module 2 also, the LED devices 30 are blue LEDs. However, in the light-emitting module 2, a total of 90 LED devices 30, larger in number than those in the light-emitting module 1, are mounted, as shown in FIG. 7. The bottom face of each LED device 30 is fixedly bonded to the upper surface of the mounting substrate 11, for example, by such means as an electrically insulating transparent adhesive, at a corresponding one of the positions exposed through the apertures 29A, 29B, and 29C.

As shown in FIG. 7, the 90 LED devices 30 are divided into five groups of 18 each. The five groups of LED devices 30 are disposed in the center region (in the aperture 29A), the left and right halves of the upper peripheral region (in the aperture 29B), and the left and right halves of the lower peripheral region (in the aperture 29C), respectively.

In the center region, six LED devices 30 are arranged vertically in FIG. 7 at horizontally centered positions, and the string of six LED devices 30 is flanked on each side by a string of four LED devices 30 which is in turn flanked on the outer side by a string of two LED devices 30. These 18 LED devices 30 are connected by wires 31, starting from the lower rightmost one and working through the upper one, the left one, the lower one, the left one, the upper one, the left one, the lower one, the left one, and the upper one, in this order from the first inner electrode 26A to the second inner electrode 26B.

In the peripheral regions, a total of 24 strings of LED devices 30, each string consisting of three linearly arranged LED devices, are arranged in a substantially equiangularly spaced, radially extending fashion with respect to the center of the mounting substrate 11, and the LED devices 30 arranged as strings are arranged in three concentric circles each containing like numbered LED devices 30 from the respective strings. The 24 strings of LED devices 30 are divided into four groups of six each in corresponding relationship to the left and right halves of the upper peripheral region and the left and right halves of the lower peripheral region. The 18 LED devices 30 in each group are connected by wires 31, first the six devices on the outer circumference, then the six devices on the intermediate circumference, and then the six devices on the inner circumference (the innermost circumference), from the first outer electrode 25A or the second outer electrode 25B to the first inner electrode 26A or the second inner electrode 26B. In the light-emitting module 2 also, the distribution of the mounting positions of the LED devices 30 has rotational symmetry (point symmetry) about the center of the mounting substrate 11.

The light-emitting module 2 has a total of five LED strings (groups), and each LED string is made up of 18 LED devices connected in series between the first electrode and the second electrode. That is, in the light-emitting module 2, the number of parallel-connected LED strings (five parallel-connected strings) is smaller than the number of LED devices 30 contained in each series connection (18 series-connected devices).

In the light-emitting module 2, since the LED devices 30 are mounted directly on the upper surface of the mounting substrate 11, i.e., the metal substrate on which the highly reflectorized layer (reflective layer) is formed, the heat dissipation effect of the LED devices 30 is high and light of high output power can be produced. Furthermore, since the first electrode and the second electrode are formed from a gold plated layer, good wire bonding can be achieved, which serves to enhance the reliability of the connections.

Further, in the light-emitting module 2 also, the LED devices 30 are surrounded by the reflecting frame 40 and the reflective layer formed on the mounting substrate 11. As a result, the light emitted from the LED devices 30 is not absorbed by the gold plated layer forming the first terminal electrode 24A, the second terminal electrode 24B, the first outer electrode 25A, and the second outer electrode 25B on the circuit substrate 20. Accordingly, in the light-emitting module 2, since most of the light emitted from the LED devices 30 is reflected upward by the reflective layer and the reflecting frame 40, the reflective efficiency is extremely high, and the light emission efficiency is also high.

In the light-emitting module 2, 18 LED devices are connected in series between the first electrode and the second electrode, and therefore, compared with the light-emitting module 1, a larger voltage must be supplied. However, in the light-emitting module 2, since the LED devices 30 can be mounted at a higher density than in the light-emitting module 1, and thus a larger number of devices can be mounted, higher brightness can be achieved. Furthermore, in the light-emitting module 2 also, the electrode structure is simple, the light-emitting region is circular in shape, and the brightness distribution has rotational symmetry.

Figure 9:
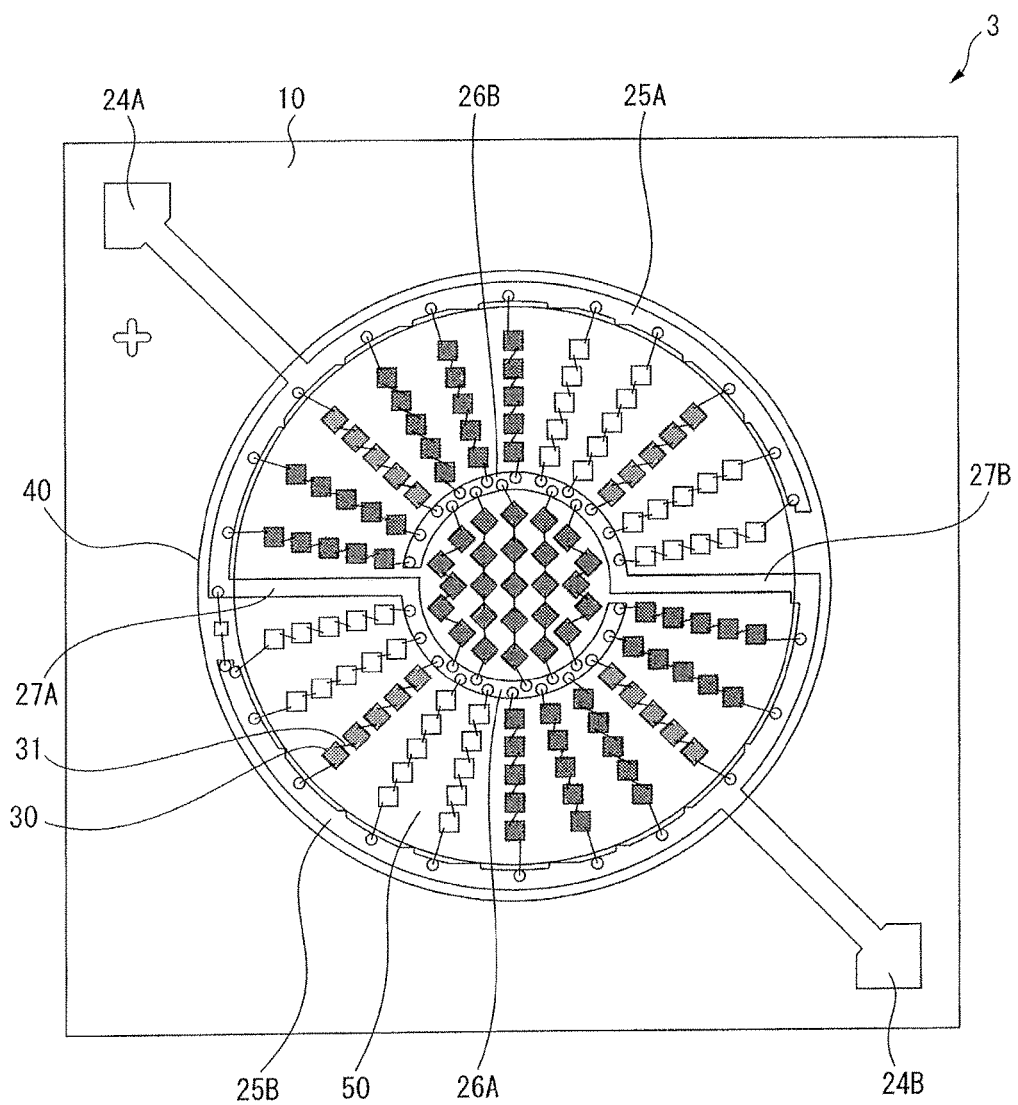
FIG. 9 shows a top plan view of another alternative light-emitting module 3.

FIG. 9 shows a top plan view of another alternative light-emitting module 3. The light-emitting module 3 is substantially identical in structure to the light-emitting module 1, the only difference being the number of LED devices 30 connected and their arrangement. In FIG. 9, the portions underlying the top layer are shown by solid lines, as in FIG. 1.

The first and second electrodes of the same configuration as that employed in the light-emitting module 1 are formed on the upper surface of the mounting substrate 10. In the light-emitting module 3, a total of 135 LED devices 30 as blue LEDs are mounted on the upper surface of the mounting substrate 10. The LED devices 30 are arranged to form a total of 27 LED strings connected in parallel between the first electrode and the second electrode, and each LED string consists of five series-connected LED devices 30. The distribution of the mounting positions of the LED devices 30 has rotational symmetry (point symmetry) about the center of the mounting substrate 10.

Twenty-five LED devices 30 are arranged in the center region bounded by the first and second inner electrodes 26A and 26B. These LED devices 30 are divided into five strings each consisting of five series-connected LED devices 30 and extending substantially linearly in the vertical direction in FIG. 9, and the five strings of LED devices 30 are connected in parallel between the first inner electrode 26A and the second inner electrode 26B.

Fifty-five LED devices 30 are arranged in each of the upper peripheral region defined between the first outer electrode 25A and the second inner electrode 26B and the lower peripheral region defined between the second outer electrode 25B and the first inner electrode 26A. The LED devices 30 arranged in these regions are divided into a total of 22 strings each consisting of five series-connected LED devices 30 and extending radially with respect to the center of the mounting substrate 10, and the 22 strings of LED devices 30 are connected in parallel between the first outer electrode 25A and the second inner electrode 26B or between the second outer electrode 25B and the first inner electrode 26A, respectively. The strings of LED devices 30 are arranged at substantially equiangularly spaced intervals, and the LED devices 30 arranged as strings are arranged in five concentric circles each containing like numbered LED devices 30 from the respective strings.

In FIG. 9, the LED devices 30 rotated by the same angle with respect to a designated side of the mounting substrate 10 are indicated in the same way. For example, the LED devices 30 indicated by white squares are all oriented in the same direction. With this direction as the reference, the LED devices 30 indicated by light gray squares and dark gray squares, respectively, are rotated anticlockwise by 45 degrees and 90 degrees, respectively, relative to the LED devices 30 indicated by the white squares. That is, the LED devices 30 indicated by the light gray squares and dark gray squares, respectively, are arranged with their two device electrodes (anode electrode and cathode electrode) differing in orientation angle by 45 degrees or 90 degrees, respectively, from those of the LED devices 30 indicated by the white squares. As shown in FIG. 9, in the light-emitting module 3, the distribution of the rotation angles of the LED devices 30 also has rotational symmetry (point symmetry) about the center of the mounting substrate 10.

When the device electrodes of the two LED devices 30 to be connected together are brought closer to each other by suitably rotating the LED devices 30, the LED devices 30 can be connected together by a wire 31 with the shortest distance. In this way, a larger number of LED devices 30 can be mounted than when all the LED devices 30 are oriented in the same direction. Since a larger number of devices are mounted in the light-emitting module 3 than in the light-emitting module 2, higher brightness can be achieved. Furthermore, in the light-emitting module 3 also, the electrode structure is simple, the light-emitting region is circular in shape, and the brightness distribution has rotational symmetry.

Figure 10:
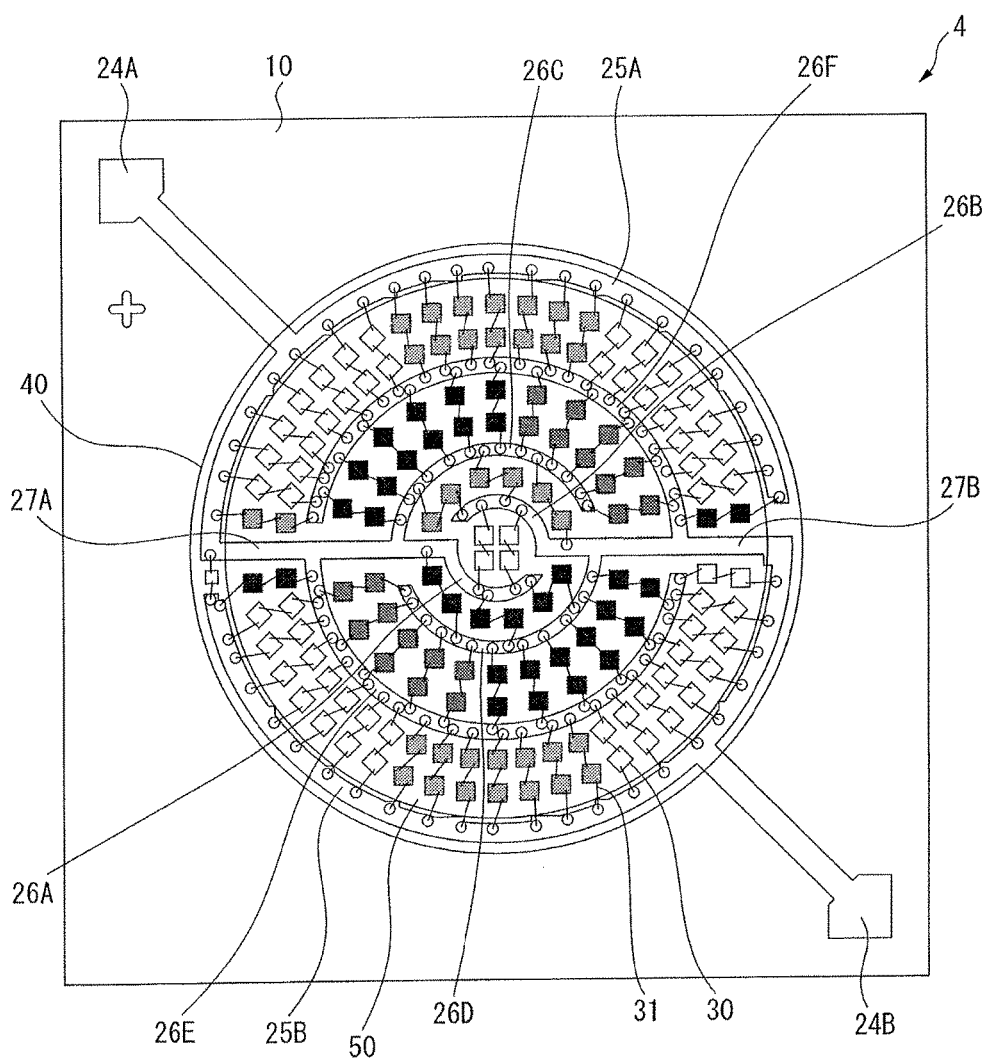
FIG. 10 shows a top plan view of still another alternative light-emitting module 4.

FIG. 10 shows a top plan view of still another alternative light-emitting module 4. The light-emitting module 4 is substantially identical in structure to the light-emitting module 1, the only differences being the configuration of the first and second electrodes and the number of LED devices 30 connected and their arrangement. In FIG. 10, the portions underlying the top layer are shown by solid lines, as in FIG. 1.

The first terminal electrode 24A, the first outer electrode 25A, the first inner electrodes 26A, 26C, and 26E, and the first connecting electrode 27A, which together constitute the first electrode, and the second terminal electrode 24B, the second outer electrode 25B, the second inner electrodes 26B, 26D, and 26F, and the second connecting electrode 27B, which together constitute the second electrode, are formed on the upper surface of the mounting substrate 10. Of these, the first terminal electrode 24A, the first outer electrode 25A, the first inner electrode 26A, the first connecting electrode 27A, the second terminal electrode 24B, the second outer electrode 25B, the second inner electrode 26B, and the second connecting electrode 27B are the same as those in the light-emitting module 1.

The first inner electrodes 26C and 26E are arcuate patterns branching off from the first connecting electrode 27A, while the second inner electrodes 26D and 26F are arcuate patterns branching off from the second connecting electrode 27B. The first inner electrode 26C and the second inner electrode 26D are formed around a circumference of a third radius, while the first inner electrode 26E and the second inner electrode 26F are formed around a circumference of a fourth radius. These electrodes are formed so as not to overlap each other. The first to fourth radii are, in decreasing order of radius, the first radius, the fourth radius, the third radius, and the second radius. That is, the first inner electrode 26E and the second inner electrode 26F, the first inner electrode 26C and the second inner electrode 26D, and the first inner electrode 26A and the second inner electrode 26B are arranged in this order inside the first and second outer electrodes 25A and 25B in decreasing order of distance to the center of the mounting substrate 10. These electrodes are arranged in concentric circles.

As shown in FIG. 10, the first outer electrode 25A, the second inner electrode 26F, the first inner electrode 26C, and the second inner electrode 26B are disposed on one side (the upper side in FIG. 10) with respect to the center of the mounting substrate 10, and the second outer electrode 25B, the first inner electrode 26E, the second inner electrode 26D, and the first inner electrode 26A are disposed on the other side (the lower side in FIG. 10). That is, the first outer electrode 25A, the second inner electrode 26F, the first inner electrode 26C, and the second inner electrode 26B are disposed so as to oppose each other, and the second outer electrode 25B, the first inner electrode 26E, the second inner electrode 26D, and the first inner electrode 26A are also disposed so as to oppose each other.

While the first electrode and the second electrode have each been constructed from two arcuate electrodes in the light-emitting modules 1 to 3, the first electrode and the second electrode in the light-emitting module 4 are each constructed from four arcuate electrodes. As a result, in the light-emitting module 4, three substantially annular peripheral regions defined by the first inner electrodes 26A, 26C, and 26E, the second inner electrodes 26B, 26D, and 26F, and the first and second outer electrodes 25A and 25B are formed so as to surround the circular center region.

In the light-emitting module 4, a total of 152 LED devices 30 as blue LEDs are mounted in these regions. The LED devices 30 are arranged to form a total of 76 LED strings connected in parallel between the first electrode and the second electrode, and each LED string consists of two series-connected LED devices 30. The distribution of the mounting positions of the LED devices 30 has rotational symmetry (point symmetry) about the center of the mounting substrate 10. The LED devices 30 mounted in the three peripheral regions are arranged in a substantially equiangularly spaced, radially extending fashion with respect to the center of the mounting substrate 10, and these LED devices 30 are arranged in five concentric circles.

In the center region bounded by the first and second inner electrodes 26A and 26B, four LED devices 30 are arranged in two strings each consisting of two series-connected LED devices 30, and the two strings of LED devices 30 are connected in parallel between these electrodes.

Six LED devices 30 organized in strings of two series-connected devices each are arranged in each of the upper peripheral region defined between the first inner electrode 26C and the second inner electrode 26B and the lower peripheral region defined between the first inner electrode 26A and the second inner electrode 26D, and a total of six strings are arranged around the same circumference and are connected in parallel between the respective electrodes. Twenty-two LED devices 30 organized in strings of two series-connected devices each are arranged in each of the upper peripheral region defined between the first inner electrode 26C and the second inner electrode 26F and the lower peripheral region defined between the first inner electrode 26E and the second inner electrode 26D, and a total of 22 strings are arranged around two circumferences with 22 LED devices 30 around each circumference, and are connected in parallel between the respective electrodes. Further, 46 LED devices 30 organized in strings of two series-connected devices each are arranged in each of the upper peripheral region defined between the first outer electrode 25A and the second inner electrode 26F and the lower peripheral region defined between the second outer electrode 25B and the first inner electrode 26E, and a total of 46 strings are arranged around two circumferences with 46 LED devices 30 around each circumference, and are connected in parallel between the respective electrodes.

In FIG. 10, the LED devices 30 rotated by the same angle with respect to a designated side of the mounting substrate 10 are indicated in the same way. For example, when the LED devices 30 indicated by white squares are taken as the reference, the LED devices 30 indicated by light gray squares, black squares, and dark gray squares, respectively, are rotated clockwise by 45 degrees, 135 degrees, and 225 degrees, respectively, relative to the LED devices 30 indicated by the white squares. That is, the LED devices 30 indicated by the light gray squares, black squares, and dark gray squares, respectively, are arranged with their two device electrodes differing in orientation angle by 45 degrees, 135 degrees, or 225 degrees, respectively, from those of the LED devices 30 indicated by the white squares. As shown in FIG. 10, in the light-emitting module 4, the distribution of the rotation angles of the LED devices 30 also has rotational symmetry (point symmetry) about the center of the mounting substrate 10.

In the light-emitting module 4, since the number of mounted devices is larger than in the light-emitting module 3, even higher brightness can be achieved. Furthermore, in the light-emitting module 4 also, the electrode structure is simple, the light-emitting region is circular in shape, and the brightness distribution has rotational symmetry.

Figure 11:
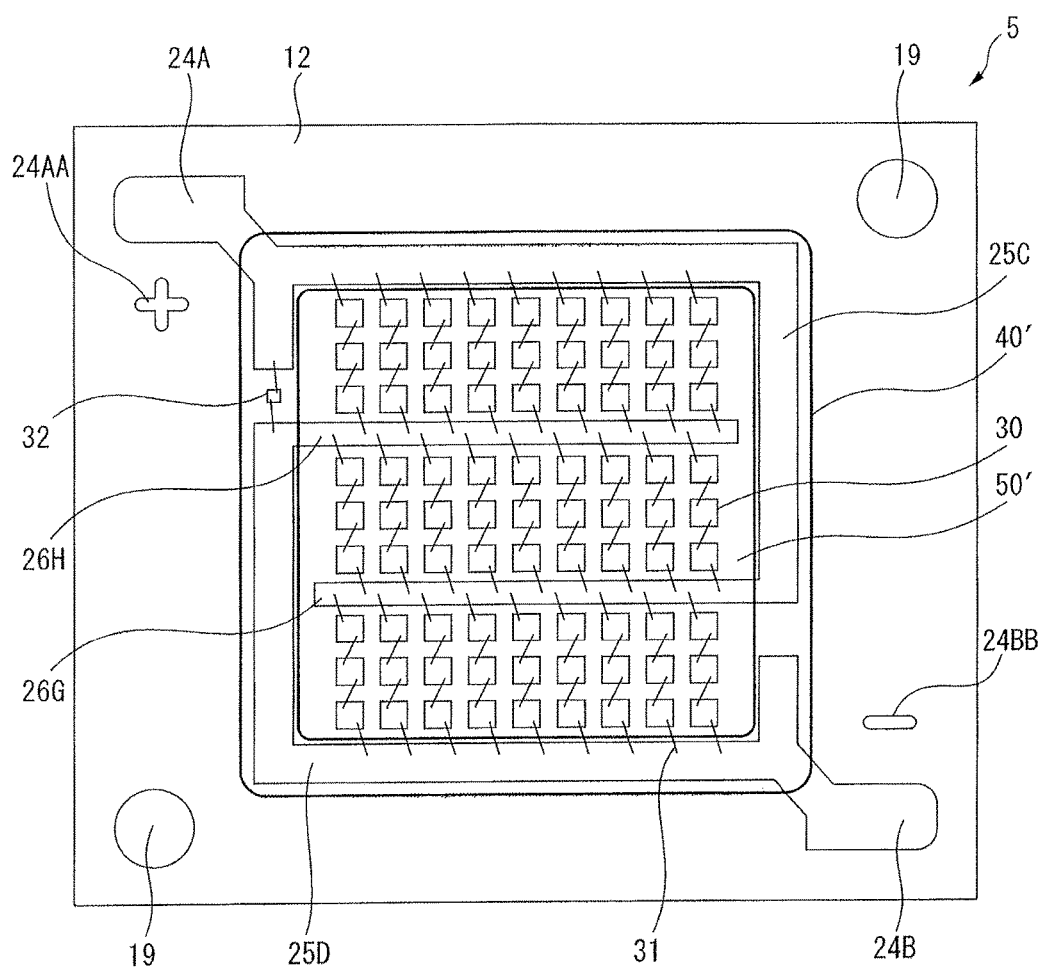
FIG. 11 shows a top plan view of yet another alternative light-emitting module 5.

FIG. 11 shows a top plan view of yet another alternative light-emitting module 5. The light-emitting module 5 includes, as its major component elements, a mounting substrate 12, LED devices 30, a reflecting frame 40', and a sealing resin 50'. The light-emitting module 5 is substantially identical in structure to the light-emitting module 1, the only differences being the configuration of the first and second electrodes, the shapes of the reflecting frame and the sealing resin, and the number of LED devices 30 connected and their arrangement. In FIG. 11, the portions underlying the top layer are shown by solid lines, as in FIG. 1.

The mounting substrate 12 is a planar ceramic substrate, and fixing through-holes 19 are formed near two diagonally opposed corners of the substrate. The first terminal electrode 24A, a first outer electrode 25C, and a first inner electrode 26G, which together constitute the first electrode, and the second terminal electrode 24B, a second outer electrode 25D, and a second inner electrode 26H, which together constitute the second electrode, are formed on the upper surface of the mounting substrate 12. In the light-emitting module 5, the reflecting frame 40' is a rectangular frame member, the mounting region for the LED devices 30 is square in shape, and the sealing resin 50' is cured in the shape of a rectangular flat plate.

The first outer electrode 25C and the second outer electrode 25D are both located under the reflecting frame 40', and are each formed in the shape of a substantially L-shaped line so that the two together surround substantially the entire mounting region for the LED devices 30. The first inner electrode 26G protrudes straight into the mounting region for the LED devices 30, which is located nearer to the center of the mounting substrate 12 than the first and second outer electrodes 25C and 25D are, from the end of the first outer electrode 25C opposite to the end connected to the first terminal electrode 24A. Likewise, the second inner electrode 26H protrudes straight into the mounting region for the LED devices 30 from the end of the second outer electrode 25D opposite to the end connected to the second terminal electrode 24B. The first outer electrode 25C with the first inner electrode 26G and the second outer electrode 25D with the second inner electrode 26H each form a substantially U-shaped pattern.

As shown in FIG. 11, one side of the first outer electrode 25C and the second inner electrode 26H are disposed on one side (the upper side in FIG. 11) with respect to the center of the mounting substrate 12, and one side of the second outer electrode 25D and the first inner electrode 26G are disposed on the other side (the lower side in FIG. 11). That is, the first outer electrode 25C and the second inner electrode 26H are disposed so as to oppose each other, and the second outer electrode 25D and the first inner electrode 26G are also disposed so as to oppose each other. The first and second inner electrodes 26G and 26H are formed by avoiding the central portion of the mounting region, and with the formation of these electrodes, the mounting region for the LED devices 30 is divided into three rectangular regions (that is, divided into three equal parts).

In the light-emitting module 5, a total of 81 LED devices 30 as blue LEDs are arranged in a square matrix of nine rows and nine columns on the upper surface of the mounting substrate 12. The LED devices 30 are organized in a total of 27 LED strings connected in parallel between the first electrode and the second electrode, and each LED string is made up of three series-connected LED devices 30.

Twenty-seven LED devices 30 organized in strings of three series-connected devices each are arranged in the center region defined between the first inner electrode 26G and the second inner electrode 26H, and a total of nine strings of LED devices 30 are connected in parallel between these electrodes. In like manner, 27 LED devices 30 organized in strings of three series-connected devices each are arranged in the upper peripheral region defined between the first outer electrode 25C and the second inner electrode 26H, and a total of nine strings of LED devices 30 are connected in parallel between these electrodes. Further, 27 LED devices 30 organized in strings of three series-connected devices each are arranged in the lower peripheral region defined between the second outer electrode 25D and the first inner electrode 26G, and a total of nine strings of LED devices 30 are connected in parallel between these electrodes.

The light-emitting region may not necessarily be formed in a circular shape, but may be formed in a rectangular shape, as in the light-emitting module 5. When the rectangular mounting region is formed using the rectangular reflecting frame 40', the LED devices 30 can be arranged in a square matrix, and thus the number of devices can be increased compared with the circular case, the net result being an increase in brightness. Further, in the light-emitting module 5 also, the electrode structure is simple, and the brightness distribution has rotational symmetry.

Figure 12:
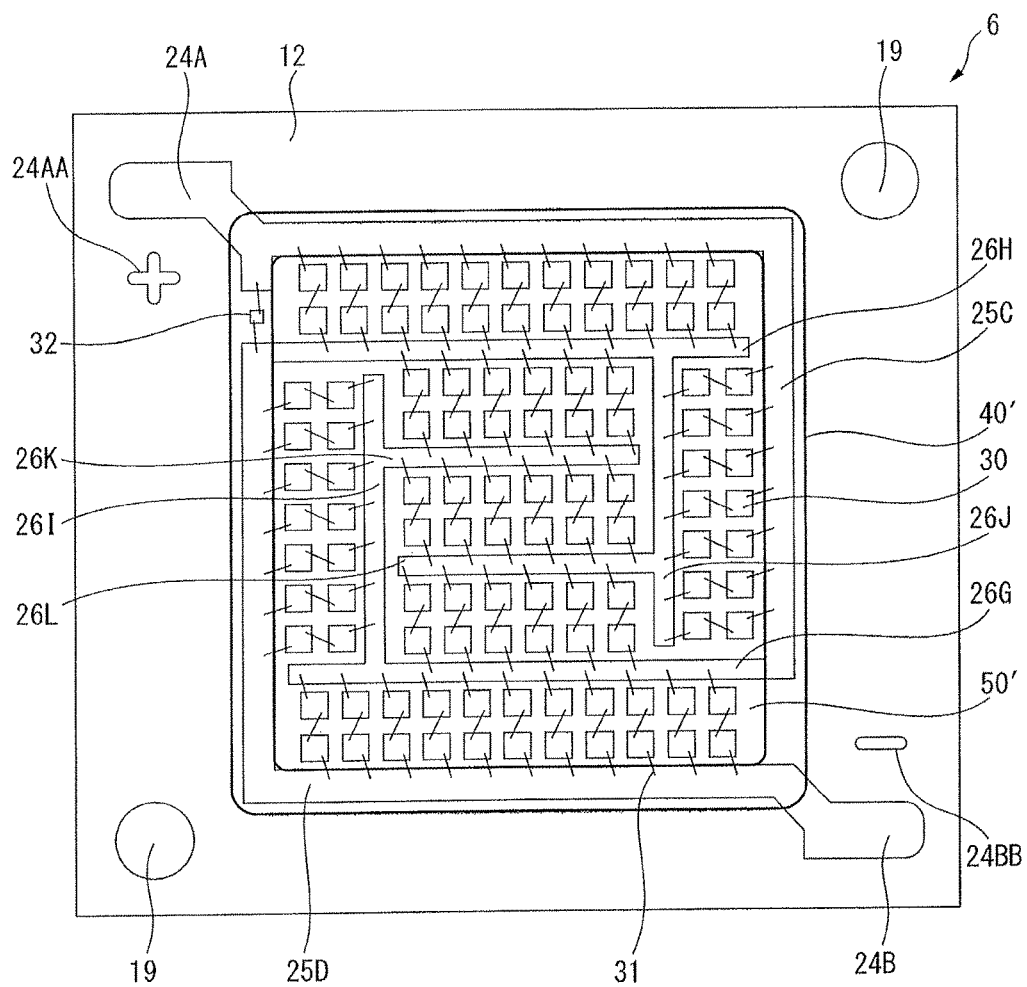
FIG. 12 shows a top plan view of still yet another alternative light-emitting module 6.

FIG. 12 shows a top plan view of still yet another alternative light-emitting module 6. The light-emitting module 6 is substantially identical in structure to the light-emitting module 5, the only differences being the configuration of the first and second electrodes and the number of LED devices 30 connected and their arrangement. In FIG. 12, the portions underlying the top layer are shown by solid lines, as in FIG. 11.

The first terminal electrode 24A, the first outer electrode 25C, and the first inner electrodes 26G, 26I, and 26K, which together constitute the first electrode, and the second terminal electrode 24B, the second outer electrode 25D, and the second inner electrodes 26H, 26J, and 26L, which together constitute the second electrode, are formed on the upper surface of the mounting substrate 12. Of these, the first terminal electrode 24A, the first outer electrode 25C, the first inner electrode 26G, the second terminal electrode 24B, the second outer electrode 25D, and the second inner electrode 26H are the same as those in the light-emitting module 5.

The first inner electrode 26I branches off vertically from the first inner electrode 26G, and the first inner electrode 26K branches off vertically from the first inner electrode 26I, both extending toward the center of the mounting substrate 12. The first inner electrodes 26G, 26I, and 26K are straight line patterns, and the length becomes shorter in this order. Likewise, the second inner electrode 26J branches off vertically from the second inner electrode 26H, and the second inner electrode 26L branches off vertically from the second inner electrode 26J, both extending toward the center of the mounting substrate 12. The second inner electrodes 26H, 26J, and 26L are straight line patterns, and the length becomes shorter in this order. The first electrode and the second electrode are each formed in a rectangular spiral pattern.

As shown in FIG. 12, one side of the first outer electrode 25C and the second inner electrode 26H are disposed in the upper side of the figure with respect to the center of the mounting substrate 12, and the other side of the first outer electrode 25C and the second inner electrode 26J are disposed in the right side of the figure, while one side of the second outer electrode 25D and the first inner electrode 26G are disposed in the lower side of the figure, and the other side of the second outer electrode 25D and the first inner electrode 26I are disposed in the left side of the figure. That is, the first outer electrode 25C and the second inner electrodes 26H and 26J are disposed so as to oppose each other, and the second outer electrode 25D and the first inner electrodes 26G and 26I are disposed so as to oppose each other. The first inner electrodes 26G, 26I, and 26K and the second inner electrodes 26H, 26J, and 26L are formed by avoiding the central portion of the mounting region, and with the formation of these electrodes, the mounting region for the LED devices 30 is divided into seven rectangular regions.

In the light-emitting module 6, a total of 108 LED devices 30 as blue LEDs are arranged in a square matrix pattern on the upper surface of the mounting substrate 12. The LED devices 30 are organized in a total of 54 LED strings connected in parallel between the first electrode and the second electrode, and each LED string is made up of two series-connected LED devices 30.

Twelve LED devices 30 organized in strings of two series-connected devices each are arranged in each of three center regions, the center region defined between the first inner electrode 26K and the second inner electrode 26L, the center region defined between the first inner electrode 26K and the second inner electrode 26H, and the center region defined between the first inner electrode 26G and the second inner electrode 26L; that is, six strings of LED devices 30 are connected in parallel between each of these electrode pairs. Similarly, 22 LED devices 30 organized in strings of two series-connected devices each are arranged in each of the upper peripheral region defined between the first outer electrode 25C and the second inner electrode 26H and the lower peripheral region defined between the second outer electrode 25D and the first inner electrode 26G; that is, 11 strings of LED devices 30 are connected in parallel between each of these electrode pairs. Further, 14 LED devices 30 organized in strings of two series-connected devices each are arranged in each of the right peripheral region defined between the first outer electrode 25C and the second inner electrode 26J and the left peripheral region defined between the second outer electrode 25D and the first inner electrode 26I; that is, seven strings of LED devices 30 are connected in parallel between each of these electrode pairs.

In the light-emitting module 6, since the number of mounted devices is larger than in the light-emitting module 5, even higher brightness can be achieved. Furthermore, in the light-emitting module 6 also, the electrode structure is simple, and the brightness distribution has rotational symmetry.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light-emitting module comprising:
    a substrate;
    a dam member disposed on the substrate;
    first and second outer electrodes which are strip-shaped conductive patterns disposed under the dam member so as to surround a mounting region surrounded by the dam member on the substrate;
    first and second inner electrodes which are strip-shaped conductive patterns disposed on the substrate and dividing the mounting region into a center region and a peripheral region, wherein the first inner electrode is opposed to the second outer electrode and is electrically connected to the first outer electrode, and wherein the second inner electrode is opposed to the first outer electrode and is electrically connected to the second outer electrode;
    a first plurality of LED devices mounted on the center region and electrically connected between the first and second inner electrodes;
    a second plurality of LED devices mounted on the peripheral region and electrically connected either between the first outer electrode and the second inner electrode or between the second outer electrode and the first inner electrode; and
    a phosphor-containing resin for integrally sealing the first and second pluralities of LED devices by being filled into all over the center region and the peripheral region.

2. The light-emitting module according to claim 1, wherein the first and second pluralities of LED devices are arranged in a number, M, of LED strings, and each LED string includes a number, N, of LED devices connected in series between the first outer and inner electrodes and the second outer and inner electrodes, where M is larger than N.

3. The light-emitting module according to claim 1, further comprising:
    a first connecting electrode, formed in a straight line pattern, for connecting the first outer electrode to the first inner electrode; and
    a second connecting electrode, formed in a straight line pattern, for connecting the second outer electrode to the second inner electrode, wherein
    the dam member is annular in shape,
    the first and second outer electrodes are both arcuate in shape, and
    the first and second inner electrodes are both arcuate in shape and are arranged on the same circumference.

4. The light-emitting module according to claim 3, wherein the first inner electrode and the second inner electrode each comprise a plurality of arcuate electrodes the number of which is the same between the first inner electrode and the second inner electrode, and the plurality of arcuate electrodes are arranged in concentric circles.

5. The light-emitting module according to claim 3, wherein the first outer and inner electrodes and the second outer and inner electrodes are point-symmetric to each other with respect to a center of the substrate.

6. The light-emitting module according to claim 2, wherein the second plurality of LED devices are arranged in radially extending fashion around the center region.

7. The light-emitting module according to claim 6, wherein the LED devices arranged as LED strings in the peripheral region are arranged in concentric circles each containing like numbered LED devices from the respective LED strings.

8. The light-emitting module according to claim 1, wherein
- the substrate includes a mounting substrate and a circuit substrate placed on top of the mounting substrate,
- the first outer and inner electrodes and the second outer and inner electrodes are disposed on the circuit substrate,
- the circuit substrate includes a plurality of apertures, and
- the center region and the peripheral region are regions of the mounting substrate that are exposed through the plurality of apertures.

\* \* \* \* \*